United States Patent
Li et al.

(10) Patent No.: US 10,466,309 B2
(45) Date of Patent: Nov. 5, 2019

(54) LOW-NOISE FLUXGATE MAGNETOMETER WITH INCREASED OPERATING TEMPERATURE RANGE

(71) Applicant: Halliburton Energy Services, Inc., Houston, TX (US)

(72) Inventors: Wenquan Li, Kingwood, TX (US); Randal Thomas Beste, Katy, TX (US); Brian Roberson, The Woodlands, TX (US)

(73) Assignee: Halliburton Energy Services, Inc., Houston, TX (US)

(*) Notice: Subject to any disclaimer, the term of this patent is extended or adjusted under 35 U.S.C. 154(b) by 0 days.

(21) Appl. No.: 16/144,254

(22) Filed: Sep. 27, 2018

(65) Prior Publication Data

US 2019/0041469 A1     Feb. 7, 2019

Related U.S. Application Data

(62) Division of application No. 14/721,542, filed on May 26, 2015, now Pat. No. 10,114,081.

(Continued)

(51) Int. Cl.
*G01R 33/00*     (2006.01)
*G01R 33/04*     (2006.01)
*G01V 3/26*      (2006.01)

(52) U.S. Cl.
CPC ....... *G01R 33/0017* (2013.01); *G01R 33/045* (2013.01); *G01V 3/26* (2013.01)

(58) Field of Classification Search
CPC .. G01R 33/0017; G01R 33/045; G01R 33/07; G01R 33/0082; G01V 3/26
(Continued)

(56) References Cited

U.S. PATENT DOCUMENTS 3,808,508 A * 4/1974 Ford ................ G01R 33/02
                                                361/140
4,293,815 A * 10/1981 West ................ G01R 33/045
                                                324/254

(Continued)

FOREIGN PATENT DOCUMENTS

| CA | 2954269 A1 * | 2/2016 | ......... G01R 33/0017 |
| CA | 2954269 A1   | 2/2016 | |

(Continued)

OTHER PUBLICATIONS

MStator, Toroidal Amorphous and Nanocrystalline Cores, http:en.mstator.ru/products/cores, Wayback date Aug. 2012. (Year: 2012).*

(Continued)

*Primary Examiner* — Jermele M Hollington
*Assistant Examiner* — Sean Curtis
(74) *Attorney, Agent, or Firm* — Gilliam IP PLLC

(57) ABSTRACT

A magnetic field measurement device includes an excitation circuit including an excitation coil that is coupled to a resonation control circuit. The excitation coil is wound around an amorphous soft magnetic core. The magnetic field measurement device includes a detection circuit including a detection coil that is wound around the amorphous soft magnetic core. The resonation control circuit is coupled to the excitation circuit and to the detection circuit to adjust a resonant frequency of the detection circuit responsive to temperature variations of the amorphous soft magnetic core.

6 Claims, 8 Drawing Sheets

Related U.S. Application Data

(60) Provisional application No. 62/035,031, filed on Aug. 8, 2014.

(58) Field of Classification Search
USPC .... 324/346, 633, 652, 668, 721, 76.51, 301, 324/200–263
See application file for complete search history.

(56) References Cited

U.S. PATENT DOCUMENTS

| | | | | |
|---|---|---|---|---|
| 4,626,782 A * | 12/1986 | Lewis | | G01R 33/04 324/253 |
| 4,656,422 A * | 4/1987 | Vail, III | | G01R 33/022 324/303 |
| 4,792,757 A * | 12/1988 | Vail, III | | G01R 33/022 324/303 |
| 4,845,434 A * | 7/1989 | Kuckes | | G01R 33/04 324/346 |
| 4,918,824 A * | 4/1990 | Farrar | | G01C 17/28 324/244 |
| 4,929,899 A * | 5/1990 | Weixelman | | G01R 33/04 324/253 |
| 5,001,426 A * | 3/1991 | Frey | | G01R 33/1215 324/259 |
| 5,015,953 A * | 5/1991 | Ferguson | | G01R 33/02 324/209 |
| 5,064,006 A * | 11/1991 | Waters | | E21B 7/068 175/45 |
| 5,230,387 A * | 7/1993 | Waters | | E21B 7/068 175/45 |
| 6,445,171 B2 * | 9/2002 | Sandquist | | G01R 15/205 324/117 R |
| 6,476,609 B1 * | 11/2002 | Bittar | | G01V 3/30 324/338 |
| 6,597,178 B1 * | 7/2003 | Nichols | | G01V 3/28 324/339 |
| 6,653,831 B2 * | 11/2003 | Friend | | G01C 17/30 324/244 |
| 6,972,563 B2 * | 12/2005 | Goldenberg | | G01R 33/04 324/253 |
| 7,053,608 B2 * | 5/2006 | Friend | | G01C 17/30 324/244 |
| 7,378,843 B2 * | 5/2008 | Beranger | | G01R 33/04 324/244 |
| 7,394,245 B2 * | 7/2008 | Brunson | | G01R 33/0286 324/244 |
| 7,463,027 B2 * | 12/2008 | Prammer | | G01N 24/081 324/303 |
| 7,501,815 B2 * | 3/2009 | Brunson | | G01R 33/022 324/244 |
| 7,557,580 B2 * | 7/2009 | Bittar | | G01V 3/28 324/337 |
| 7,733,086 B2 * | 6/2010 | Prammer | | G01V 3/32 324/300 |
| 7,878,270 B2 * | 2/2011 | Lee | | E21B 43/305 175/61 |
| 8,085,049 B2 * | 12/2011 | Bittar | | G01V 3/28 324/337 |
| 8,085,050 B2 * | 12/2011 | Bittar | | G01V 3/28 324/339 |
| 8,098,066 B2 * | 1/2012 | Ledoux | | G01G 19/12 324/244 |
| 8,146,685 B2 * | 4/2012 | Lee | | E21B 43/305 175/61 |
| 8,237,438 B2 * | 8/2012 | Bazinet | | G01R 33/05 324/253 |
| 8,272,447 B2 * | 9/2012 | Lee | | E21B 43/305 166/380 |
| 8,347,985 B2 * | 1/2013 | Bittar | | E21B 47/0905 175/61 |
| 8,890,531 B2 * | 11/2014 | Beste | | G01V 3/28 324/339 |
| 9,206,644 B2 * | 12/2015 | Clark | | E21B 4/02 |
| 9,206,672 B2 * | 12/2015 | Cooley | | E21B 41/0085 |
| 9,732,559 B2 * | 8/2017 | Bittar | | E21B 47/02216 |
| 10,114,081 B2 * | 10/2018 | Li | | G01R 33/0017 |
| 2003/0094942 A1 * | 5/2003 | Friend | | G01C 17/30 324/244 |
| 2004/0080316 A1 * | 4/2004 | Friend | | G01C 17/30 324/244 |
| 2005/0030021 A1 * | 2/2005 | Prammer | | G01N 24/081 324/303 |
| 2006/0124360 A1 * | 6/2006 | Lee | | E21B 43/305 175/61 |
| 2007/0030001 A1 * | 2/2007 | Brunson | | G01R 33/0283 324/244 |
| 2007/0096729 A1 * | 5/2007 | Brunson | | G01R 33/022 324/244 |
| 2007/0277620 A1 * | 12/2007 | Melamud | | G01L 9/0022 73/766 |
| 2007/0296410 A1 * | 12/2007 | Blumberg | | G01R 33/02 324/244 |
| 2009/0072825 A1 * | 3/2009 | Prammer | | G01N 24/081 324/303 |
| 2009/0091328 A1 * | 4/2009 | Clark | | G01V 3/28 324/338 |
| 2010/0224415 A1 * | 9/2010 | Lee | | E21B 43/305 175/61 |
| 2011/0006773 A1 * | 1/2011 | Bittar | | E21B 47/02216 324/333 |
| 2011/0114388 A1 * | 5/2011 | Lee | | E21B 43/305 175/61 |
| 2011/0180327 A1 * | 7/2011 | Bittar | | E21B 47/0905 175/61 |
| 2012/0145463 A1 * | 6/2012 | Lee | | E21B 43/305 175/79 |
| 2012/0283951 A1 * | 11/2012 | Li | | G01V 3/28 702/7 |
| 2013/0285665 A1 * | 10/2013 | Wu | | G01V 3/28 324/339 |
| 2014/0167759 A1 * | 6/2014 | Pines | | G01N 24/081 324/322 |
| 2014/0288862 A1 * | 9/2014 | West | | G01R 33/025 702/65 |
| 2015/0101404 A1 * | 4/2015 | Chen | | E21B 49/08 73/152.05 |
| 2015/0177413 A1 * | 6/2015 | Wilt | | G01V 3/30 324/337 |
| 2016/0041233 A1 * | 2/2016 | Li | | G01R 33/0017 324/346 |
| 2016/0131791 A1 * | 5/2016 | Wu | | G01V 3/38 702/7 |
| 2016/0238673 A1 * | 8/2016 | Honkura | | G01R 33/06 |
| 2016/0370488 A1 * | 12/2016 | San Martin | | E21B 47/122 |
| 2019/0041469 A1 * | 2/2019 | Li | | G01R 33/0017 |

FOREIGN PATENT DOCUMENTS

| | | | | |
|---|---|---|---|---|
| CN | 102478646 A | * | 5/2012 | |
| GB | 201700344 | * | 2/2017 | ......... G01R 33/0017 |
| GB | 2542085 A | * | 3/2017 | ......... G01R 33/0017 |
| GB | 2542085 A | | 9/2017 | |
| WO | 2016022194 A1 | | 2/2016 | |
| WO | WO-2016022194 A1 | * | 2/2016 | ......... G01R 33/0017 |

OTHER PUBLICATIONS

CA Application Serial No. 2,954,269, First Office Action, dated Mar. 28, 2018, 3 pages.

GCC Application Serial No. 2015/29636; GCC Examination Report; dated Jan 18, 2018, 5 pages.

"14. About Electronic Magnetometers and about Smoking", [online]. [archived on Feb. 26, 2013]. Retrieved from the Internet: <URL: http://web.archive.org/web/20130216031451/http://istp.gsfc.nasa.gov/earthmag/magmeter.htm>, 3 pgs.

"International Application Serial No. PCT/US2015/032403, International Search Report dated Aug. 26, 2015", 3 pgs.

(56) References Cited

OTHER PUBLICATIONS

"International Application Serial No. PCT/US2015/032403, Written Opinion dated Aug 26, 2015", 5 pgs.
"Mag610 and Mag611 High Temperature Three-Axis Fluxgate Probes Brochure", Jan. 1, 2014 00:00:00.0, 4 pgs.
"Magnetometer Comparision, Billingsley Aerospace & Defense", Retrieved from the Internet: <URL: http:// magnetometer.com/wp-content/uploads/magnetometer-comaparison.pdf>, 4 pgs.
"Magnetometers. Barnard Microsystems Limited", (c) 2012 Barnard Microsystems Limited. [online]. [archived on Sep. 21, 2013]. Retrieved from the Internet: <URL: http://web.archive.org/web/20130921171035/ http://www.barnardmicrosystems.com/L4E_magnetometer.htm>, Jan. 1, 2012 00:00:00.0, 10 pgs.
"Soft Magnetic Materials and Semi-finished Products", (c) 2002 Vacuumschmelze GMBH & Co. KG, Jan. 1, 2002 00:00:00.0, 32 pgs.
"Toroidal Amorphous and Nanocrystalline Cores", http:en.mstator. ru/products/cores, Wayback date Aug. 2012, 3.
Butta, et al., "Sources of Noise in a Magnetometer Based on Orthogonal Fluxgate Operated in Fundamental Mode", IEE Transactions on Magnetics, 48(4), Apr. 4, 2012 00:00:00.0, 1508-1511.
Herzer, "Modern soft magnets: Amorphous and nanocrystalline materials", Acta Materialia, 61, Aug. 1, 2013 00:00:00.0, 718-734.
Nielsen, et al., "Development, construction and analysis of the 'Orsted' fluxgate magnetometer", Meas. Sci. Technol. 6, Jan. 1, 1995 00:00:00.0, 1099-1115.
Primdahl, "The Fluxgate Magnetometer", Phys. E. Sci. Instrum., 12, Jan. 1, 1979 00:00:00.0, 241-253.
Ripka, et al., "Fluxgate: Tuned vs. Untuned Output", IEEE Transactions on Magnetics, 34(4), Jul. 1, 1998 00:00:00.0, 1303-1305.

\* cited by examiner

LOW-NOISE FLUXGATE MAGNETOMETER WITH INCREASED OPERATING TEMPERATURE RANGE

BACKGROUND

Understanding the structure and properties of geological formations can reduce the cost of drilling wells for oil and gas exploration. Measurements made in a borehole (i.e., downhole measurements) are typically performed to attain this understanding, to identify the composition and distribution of material that surrounds the measurement device downhole. To obtain such measurements, magnetometers are sometimes applied to provide telemetry, ranging, and bit location functions.

Magnetometers with very low noise floors have recently become available. For example, some references for magnetometers quote noise floors on the order of 10 pT RMS/$\sqrt{Hz}$. In order to reach such low noise floors, these magnetometers may be built with a soft magnetic core with high relative permeability. However, magnetometers built with these soft magnetic cores may not operate reliably at high temperatures.

DETAILED DESCRIPTION

Figure 1:
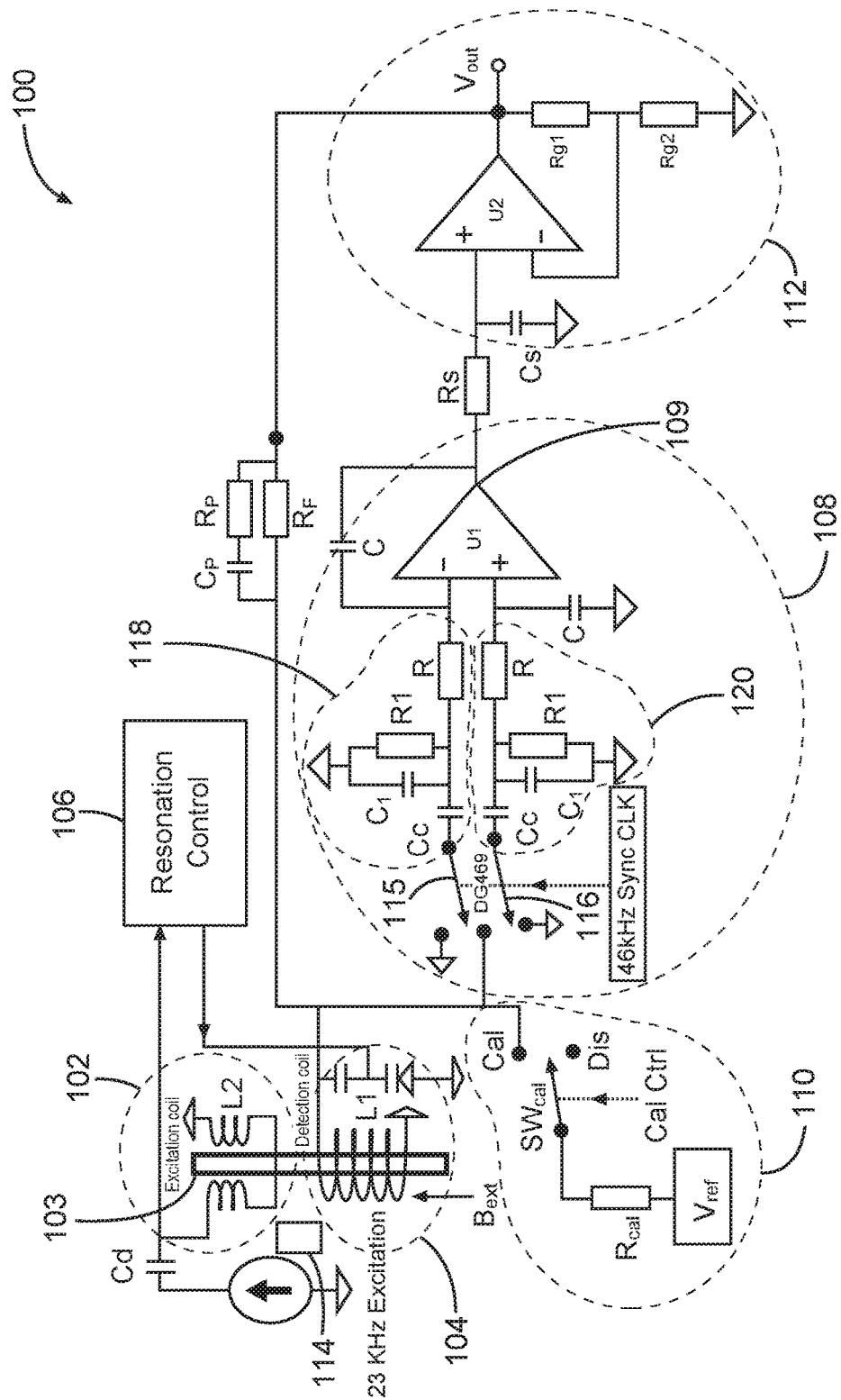
FIG. 1 is a block diagram of a super-low noise fluxgate magnetometer in accordance with some embodiments.

To address some of the challenges described above, as well as others, magnetic field measurement devices, such as low-noise fluxgate magnetometers that can operate over large temperature ranges, and systems and methods of using same, are described herein.

Properly configured, high sensitivity magnetometers can be used downhole for EM telemetry, ranging to metal (particularly magnetic) objects, and for determining the location of a drill bit. Unlike SQUIDs (superconducting quantum interference devices), which are operated in a cryogenic environment, fluxgate magnetometer devices can operate at much higher temperatures, and are therefore well-suited to geophysical applications (such as at temperatures greater than 95° C.-160° C.). The basic application of magnetometers to reception of EM telemetry signals at the Earth's surface, or to determining drill bit location, are well-known to those of ordinary skill in the art.

Low-noise operations can be an issue with some magnetometers. Noise sources in a fluxgate magnetometer can include noise resulted from the loss of energy due to fluxgate eddy-currents, the noise caused by the energy loss needed to overcome the coercivity of the fluxgate during each cycle of driving, Barkhausen noise, and noise generated by other portions of the electronics included in the fluxgate magnetometer. Some currently-available fluxgate magnetometers can achieve super-low noise performance, in some cases on the order of about 10 pT RMS/$\sqrt{Hz}$, by including an amorphous soft magnetic core of super-high relative permeability $\mu$ on the order of greater than 90,000. Some examples include the VITRO VAC 6025 core and the VITROPERM 800, each available from VACUUMSCHMELZE GmbH & Co. of Hanau, Germany. However, with increased permeability, these cores are proportionately more sensitive to variations and extremes of temperature. For example, when some available super-low noise fluxgate magnetometers are exposed to temperatures higher than 85° C., the fluxgate magnetometer experiences variations in permeability of the soft magnetic core. These variations in permeability cause the resonant frequency of the fluxgate detection circuit to deviate from the excitation frequency, and this deviation generates deterioration in the signal-to-noise ratio (SNR) of the magnetometer.

Additionally, permeability of the fluxgate can change with time, particularly after the fluxgate experiences repeated thermal stresses or mechanical shocks as can commonly occur in downhole environments. For at least these reasons, some available low-noise fluxgate magnetometers may have only limited usefulness for downhole applications, such as magnetic ranging in oil fields, where fluxgate magnetometers may be subjected to very high temperatures and other stresses.

Apparatuses, systems and methods described herein with respect to some embodiments can provide fluxgate magnetometers capable of reliable operation in a temperature range from about −20° to 150° Celsius, while still having a noise floor on the order of about 10 pT RMS/$\sqrt{Hz}$. Example embodiments provide other electronics and sub-circuits as described in more detail below with respect to FIGS. 1-3, to prevent the temperature-caused deteriorations or other deteriorations in the SNR performance of the fluxgate.

FIG. 1 is a block diagram of an example low-noise fluxgate magnetometer 100 (e.g., a magnetic field measurement device) in accordance with some embodiments. The fluxgate magnetometer 100 includes an excitation circuit 102 including an excitation coil L2. The excitation coil L2 can be wound around an amorphous soft magnetic core 103. The core 103 can have a negative temperature coefficient such that inductance of the excitation circuit 102 decreases (e.g., the core 103 has an inductance variation) with increasing temperature of the core 103. By way of non-limiting example, fluxgates used in magnetometers and systems according to various embodiments can include an amorphous VITRO VAC 6025 core, available from VACUUMSCHMELZE GmbH & Co. of Hanau, Germany.

The fluxgate magnetometer 100 additionally includes a detection circuit 104 including a detection coil L1. The detection circuit 104 detects an external magnetic field according to principles understood by those of ordinary skill in the art. The detection coil L1 will be wound around the same core 103 as L2, such that inductance of the detection circuit 104 decreases with increasing temperature of the core 103.

Fluxgate magnetometers 100 in accordance with example embodiments can boost the SNR, the open-loop sensitivity of the fluxgate, and other characteristics by using a high-Q detection circuit 104 that is resonant with the driving frequency of the fluxgate. Because of this high Q, the detection circuit 104 will have a narrow bandwidth within which the resonant frequency remains resonant. In order to maintain the detection circuit 104 resonant with the driving frequency throughout a large temperature range, embodiments provide a resonation control circuit 106. The resonation control circuit 106 couples to the excitation circuit 102 and to the detection circuit 104 to adjust (e.g., tune) the resonant frequency of the detection circuit 104 responsive to temperature variations of the core 103. The resonation control circuit 106 tracks the variation of the resonant frequency of the excitation circuit 102 and the detection circuit 104 with temperature.

Figure 2:
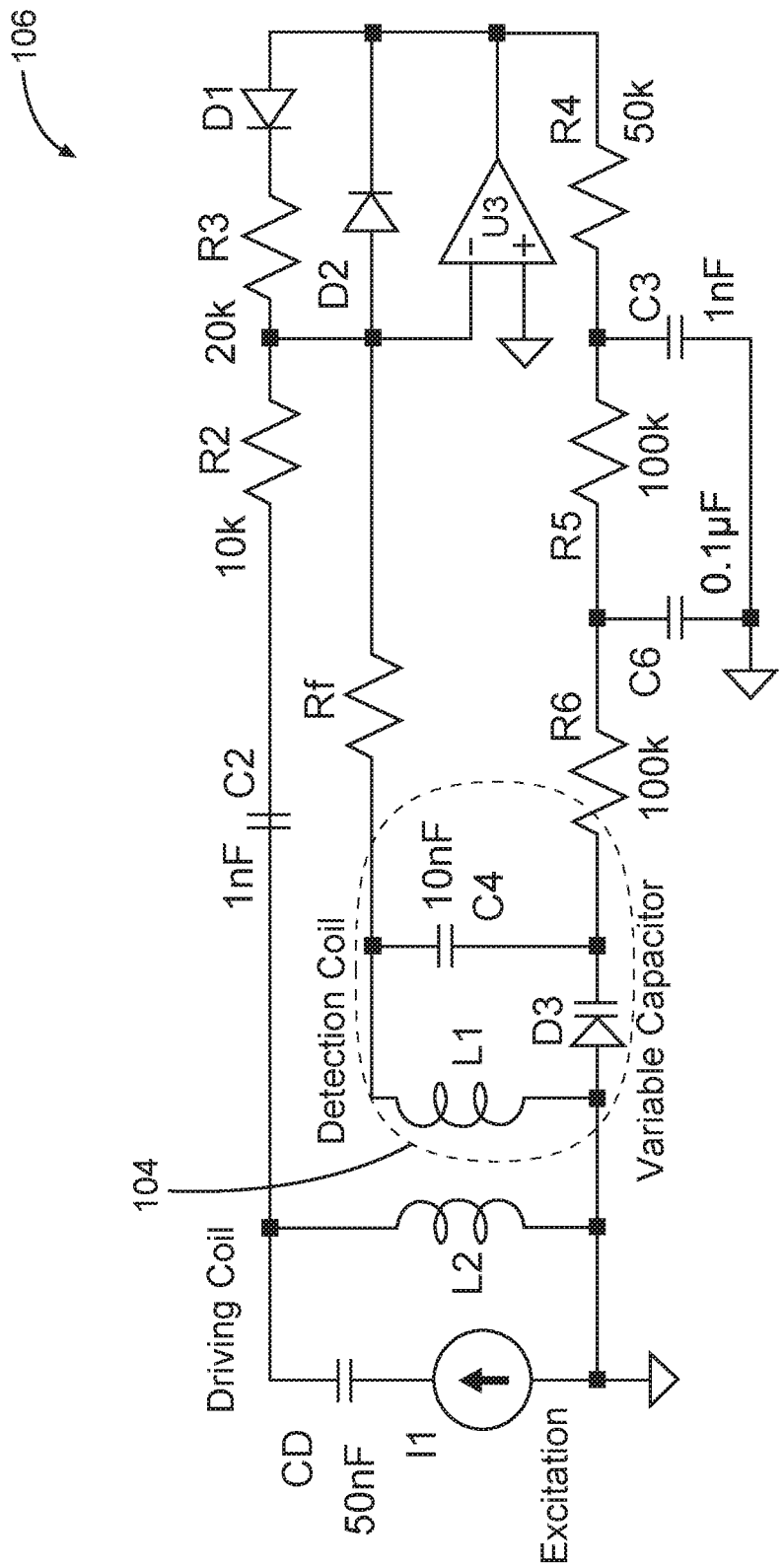
FIG. 2 is a block diagram of a resonation control circuit in accordance with some embodiments.

FIG. 2 is a block diagram of an example resonation control circuit 106 in accordance with some embodiments. The resonation control circuit 106 tunes the resonant frequency of the detection circuit 104 by using a control signal from L2. The resonation control circuit 106 includes an operational amplifier U3 with an inverting input coupled to the excitation circuit 102 such that a direct current (DC) output of the operational amplifier U3 varies according to inductance changes of the excitation circuit 102. The resonation control circuit 106 further includes a variable capacitive element such as the variable capacitor D3 coupled between the detection circuit 104 and the non-inverting output of the operational amplifier U3 to adjust capacitance of the detection circuit 104 responsive to variations in the DC output of the operational amplifier U3.

As described earlier herein, the excitation coil L2 and the detection coil L1 are wound on the same amorphous magnetic core (e.g., VAC 6025). Because the temperature coefficient of the core 103 is negative, when temperature of the fluxgate increases, the inductance of both L1 and L2 will drop due to the decrease of the permeability of the core 103. This will cause the voltage across L2 to drop, causing the DC output of amplifier U3 to drop, and eventually causing the DC voltage across D3 to drop. This will cause the capacitance of the detection circuit 104 to increase, therefore, decreasing the resonant frequency of the detection circuit 104 to bring the resonant frequency of the detection circuit 104 back to the center of the resonation region. Without this chain reaction created by the resonation control according to some embodiments, the output voltage of the L1 circuit will drop, thereby causing reduction of the open-loop sensitivity of the fluxgate.

Figure 3:
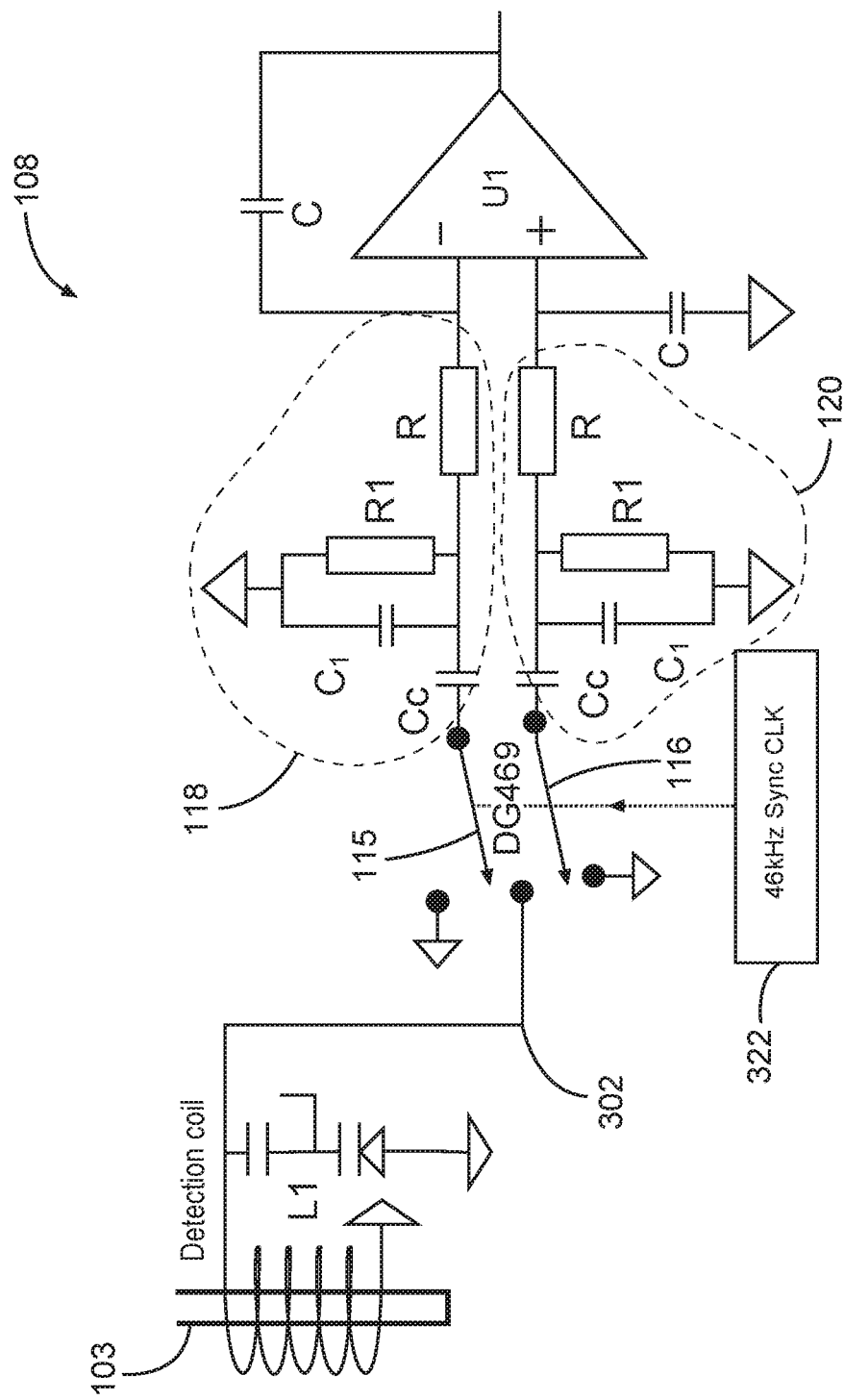
FIG. 3 is a block diagram of a synchronic phase detection and integrator circuit with symmetrical input in accordance with some embodiments.

Referring again to FIG. 1, the fluxgate magnetometer 100 can include an integrator circuit 108 configured to perform synchronic phase detection and integration. FIG. 3 is a block diagram of an integrator circuit 108 with symmetrical input in accordance with some embodiments.

The integrator circuit 108 can improve the noise performance of the fluxgate magnetometer 100, particularly in the low frequency band below about 20 Hz. The integrator circuit 108 integrates the output of the detection circuit 104. The integrator circuit 108 includes an integration amplifier U1 with an inverting input and a non-inverting input and with symmetrical circuitry 118, 120 coupled to each of the inverting input and non-inverting input of the integration amplifier U1. The symmetrically-configured input can help protect against thermally-induced noise in the fluxgate magnetometer 100.

The integrator circuit 108 includes a switch circuit DG469 including a first switching mechanism 115 and a second switching mechanism 116 coupled to the inverting input and the non-inverting input of the integration amplifier U1. The integrator circuit 108 includes a clock input 322 to control the switching mechanism DG469 in a synchronized fashion to switch at a frequency double the frequency of an excitation input to the excitation circuit 102 (FIG. 1). The clock input 322 controls the first switching mechanism 115 and the second switching mechanism 116 such that the inverting input of the integration amplifier U1 is coupled to the output of the detection coil L1 and the non-inverting input is coupled to ground during a positive phase of the output of the detection circuit 104. For example, the clock input 322 can be phase locked to an excitation output of the excitation circuit 102. During a negative phase of the output of the detection circuit 104, the inverting input is coupled to ground and the non-inverting input is coupled to the output of the detection coil L1.

The symmetrical circuitry 118 and 120 includes two R1 resistors provide a pair of symmetrical DC paths to the ground for the input bias currents of integration amplifier U1. By providing the pair of symmetrical DC paths, some embodiments reduce or eliminate the effect of the thermal fluctuations of the input bias currents, and therefore, reduce the thermally induced low-frequency noise. The two C1 capacitors can absorb switching spikes of the first switching mechanism 115 and the second switching mechanism 116.

Referring again to FIG. 1, the fluxgate magnetometer 100 can include a temperature calibration circuit 110 for temperature calibration of the fluxgate magnetometer 100 during downhole operation of the magnetometer or in a laboratory environment. To be able to calibrate the magnetometer in the lab or downhole application, the calibration circuit 110 of FIG. 1 is calibrated in some embodiments during the manufacturing phase of the magnetometer, which will be described in more detail below with respect to FIGS. 4-6.

The fluxgate magnetometer 100 can further include a gain stage 112 coupled to an output 109 of the synchronic phase detection and integrator circuit 108. The gain stage 112 can include at least an operational amplifier U2 in addition to other control or protection circuitry such as gain-setting resistors $R_{g1}$ and $R_{g2}$. The fluxgate magnetometer 100 includes a temperature sensor, for example a thermistor 114, such that the output of the fluxgate magnetometer 100 includes both the measured magnetic field and the fluxgate magnetometer 100 temperature for sensitivity compensation and verification. The thermistor 114 can measure or read the temperature of the fluxgate in real-time.

Figure 4:
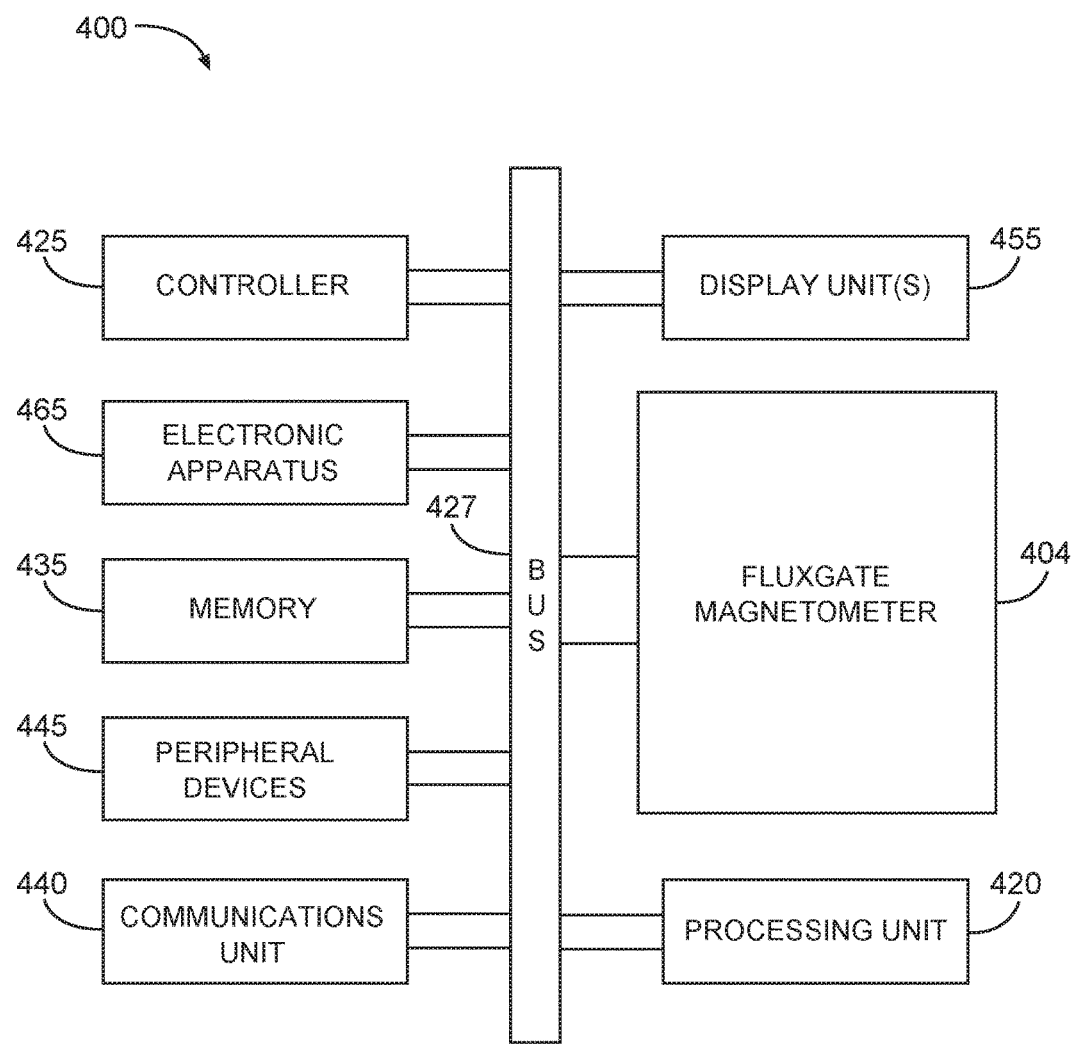
FIG. 4 is a block diagram of a system according to various embodiments of the invention.

FIG. 4 depicts a block diagram of features of a logging system 400 in accordance with various embodiments. The logging system 400 can provide magnetic measurements and calibration of fluxgate magnetometers 100 (FIG. 1) for use in capturing magnetic measurements, among other functions and uses. The logging system 400 includes fluxgate magnetometer 404 operable in a wellbore. The circuitry for fluxgate magnetometer 404 may include some or all of the circuits and sub-circuits as discussed with respect to FIGS. 1-3.

The processing unit 420 can couple to the fluxgate magnetometer 404 to obtain measurements from the fluxgate magnetometer 404. The processing unit 420 can perform operations to calibrate the fluxgate magnetometer 404 as will be described in more detail below.

The transfer function of the fluxgate magnetometer 404 specifies the precision, linearity and frequency response of the fluxgate magnetometer 404. The transfer function of the entire fluxgate magnetometer 404 can be written as:

$$V_{out} = \frac{-S_o G_C \beta \left(1 + \frac{R_{g2}}{R_{g1}}\right)(R_F + r + j\omega L_1)}{j\omega CR(R_F + r + j\omega L_1) + aS_o G_C \beta_1 \left(1 + \frac{R_{g2}}{R_{g1}}\right)} B_{ext} \quad (1)$$

where, $V_{out}$ is the output voltage of the fluxgate magnetometer 404 as shown in FIG. 1, $B_{ext}$ the input magnetic field applied to the fluxgate, and ω is the angular frequency (in radians) of $B_{ext}$, which can also be expressed as ω=2·π·f where f is the frequency of $B_{ext}$. Other variables of Equation (1) are defined in more detail below.

Since the inductance $L_1$ of the detection coil L1 is in the order of several millihenries (mH), and the feedback resistance $R_F$ is in the order of several kΩ, so jωL$_1$ is negligible when compared with $R_F$, because f is much smaller than the driving frequency of the fluxgate. And therefore, Equation (1) becomes:

$$V_{out} = \frac{-S_o G_C \beta \left(1 + \frac{R_{g2}}{R_{g1}}\right)}{j\omega CR + G_L} B_{ext} \quad (2)$$

where R and C are the integration amplifier U1 integration resistor and capacitor as shown in FIGS. 1 and 3, and GL is the loop gain of the fluxgate magnetometer 404:

$$G_L = \frac{\alpha S_0 G_C \beta \left(1 + \frac{R_{g2}}{R_{g1}}\right)}{R_F + r} \quad (3)$$

α is the ratio of the feedback magnetic field to the feedback current, $S_o$ is the open-loop sensitivity of the fluxgate, $G_C = C_1/(C_C+C_1)$ (from FIG. 3), β the modulation index, 0.5≤β≤1, where the value of β for a VAC 6025-based fluxgate of some embodiments is 0.75, $R_{g1}$ and $R_{g2}$ are the gain resistors of amplifier U2 (FIG. 1), $R_F$ is the feedback resistance (FIG. 1) of the fluxgate magnetometer 404, and r the DC resistance of L1.

When loop gain $G_L$ is much larger than jωCR of Equation (2), then the transfer function of the fluxgate magnetometer 404 can be expressed as:

$$V_{out} = \frac{-R_F - r}{\alpha} B_{ext} \quad (4)$$

To determine the −3 dB frequency of the fluxgate magnetometer 404, Equation (2) can be expressed as:

$$V_{out} = \frac{-\frac{R_F + r}{\alpha}}{1 + j\frac{f}{f_c}} B_{ext} \quad (5)$$

where $f_C$ is the −3 dB frequency of the fluxgate magnetometer 404:

$$f_C = \frac{G_L}{2\pi RC} \quad (6)$$

When f<<$f_C$, Equation (5) becomes Equation (4). Equation (5) can be used to check and adjust the dynamic characteristics of the fluxgate magnetometer during the calibration of the entire fluxgate magnetometer. Equation 4 is used to decide the actual loop gain $G_L$ through the measurement of the −3 dB frequency.

The linear operation of the fluxgate magnetometer 404 depends on the feedback loop to inject a feedback current into detection coil L1 through $R_f$ in order to nullify the external magnetic field applied to the fluxgate. To make the feedback loop work reliably and linearly in over a large temperature range, for example between −20° C. and 150° C., loop gain $G_L$ of Equation (3) will be much larger than jωCR in the entire temperature range, according to Equation (2). When $G_L$ is sufficiently large, the output $V_{out}$ of the fluxgate magnetometer 404 depends only upon $B_{ext}$, $R_F$, r, and α. Accordingly, the errors of the fluxgate magnetometer in nonlinearity and closed-loop sensitivity can be effectively controlled by choosing a high-precision feedback resistor $R_F$, a small r, and a temperature-calibrated α.

Referring again to FIG. 1, a periodic real-time sensitivity calibration of the fluxgate magnetometer can be performed under the control of controller 425 during the normal downhole operation of the magnetometer 404 through the temperature calibration circuit 110, which includes a resistor $R_{cal}$, a calibration switch $SW_{cal}$, and a voltage source $V_{ref}$ that works with $R_{cal}$ to provide a current $I_{cal}$.

During a downhole calibration phase, when $SW_{cal}$ switches to the Cal position, a fixed calibration current $$I_{cal} = \frac{V_{ref}}{R_{cal} + r}$$

will be injected into the detection coil to generate what can typically be assumed to be a fixed calibration magnetic field $B_{cal}$. When the Cal Ctrl is a square-wave pulse train, the generated calibration magnetic field $B_{cal}$ and the output of the fluxgate magnetometer $V_{out}$ will also have a square-wave-like waveform. Because the amplitude of the square-wave calibration magnetic field $B_{cal}$ is known, the sensitivity of the magnetometer at any temperature during the downhole operation can be calculated by dividing the amplitude of the calibration magnetic field $B_{cal}$ by the voltage amplitude of the square-wave output $V_{out}$ of the fluxgate magnetometer 100 that was obtained at that temperature.

To help ensure the accuracy of the generated calibration magnetic field $B_{cal}$ for the entire temperature range of the fluxgate magnetometer operation, the $B_{cal}$ needs to be measured and calibrated with a Helmholtz coil (not shown in FIG. 1) during the manufacturing phase of the fluxgate magnetometer. The following is an example calibration process of $B_{cal}$ during the manufacturing phase of the fluxgate magnetometer.

Figure 5:
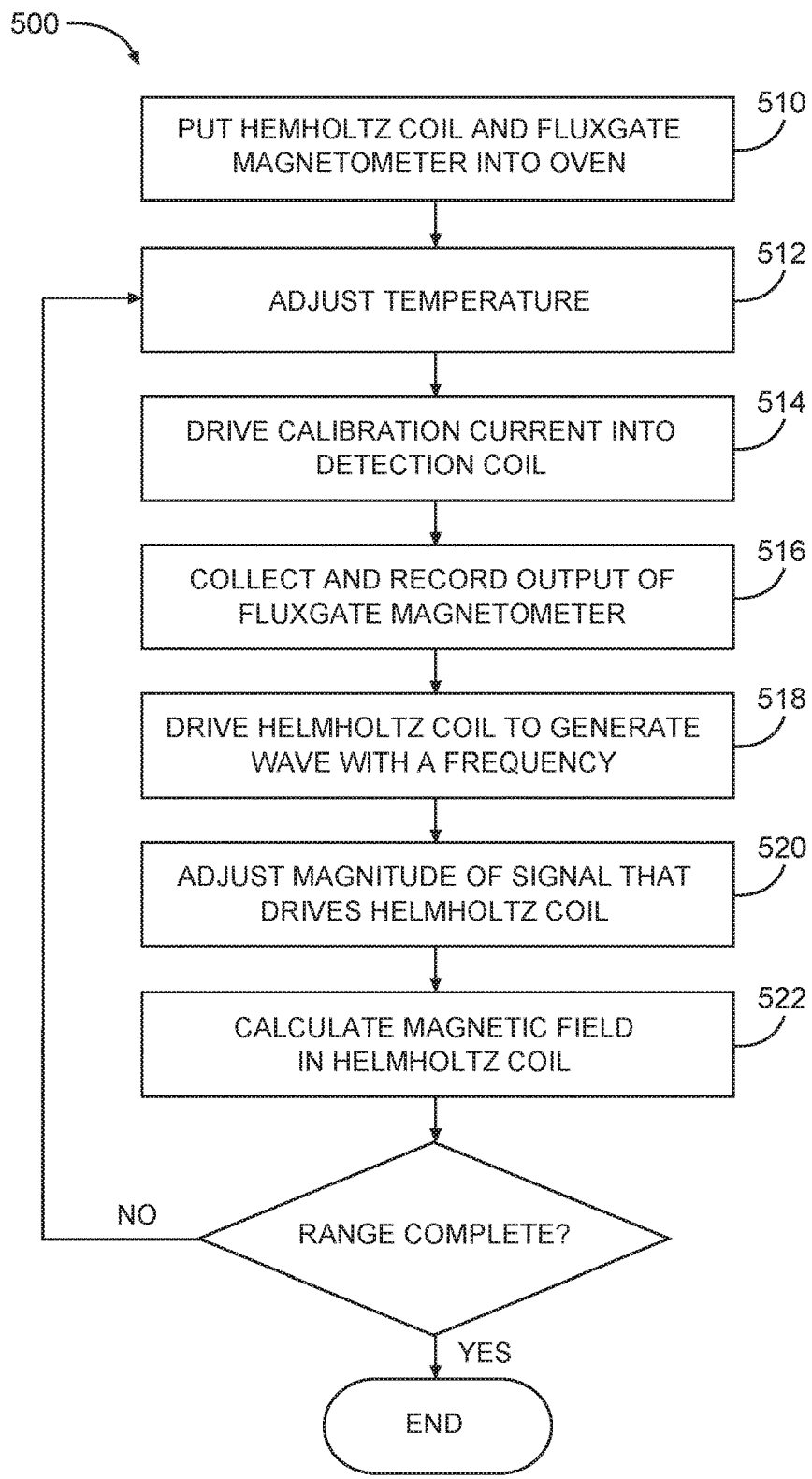
FIG. 5 is a flowchart of an example method for calibrating the calibration circuit in accordance with some embodiments.
Figure 6:
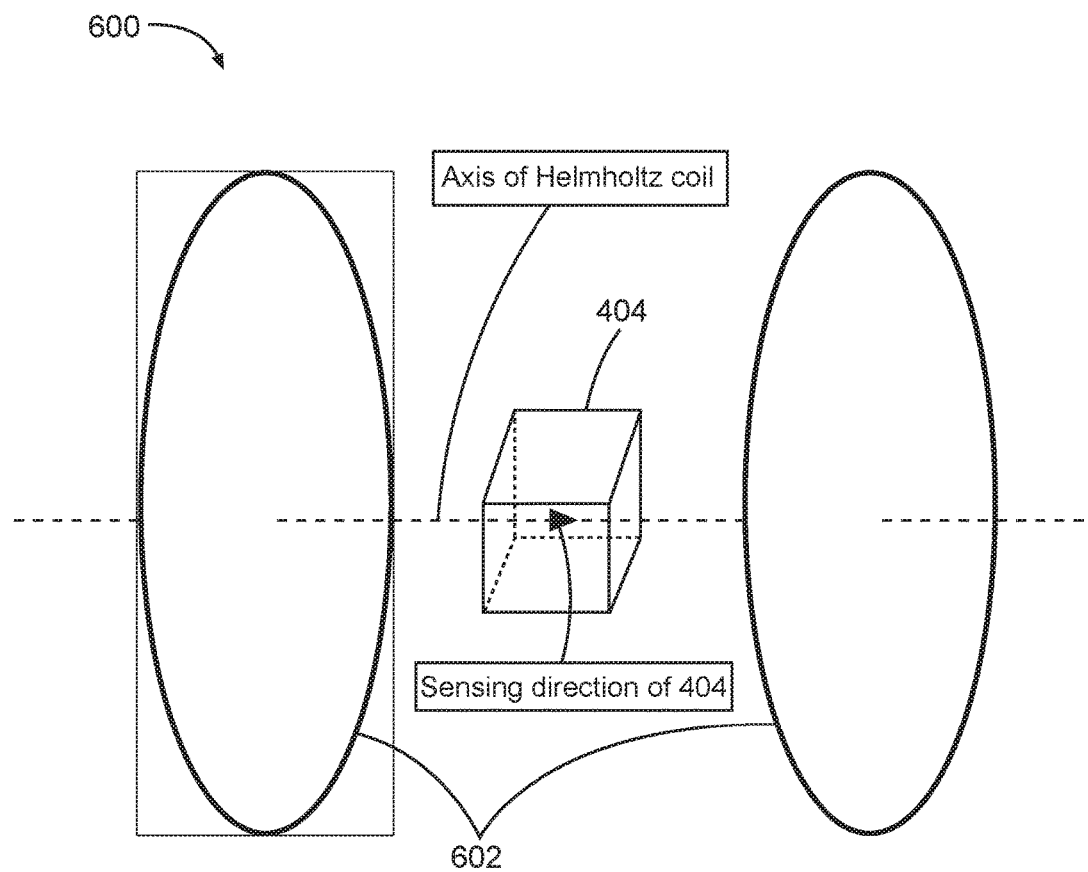
FIG. 6 is a system for calibrating the calibration circuit in accordance with some embodiments.

First, fluxgate magnetometer 404 and its temperature calibration circuit 110, which includes the calibration switch $SW_{cal}$, resistor $R_{cal}$, voltage source $V_{ref}$, and the thermistor 114 are all placed in a temperature oven. The calibration switch $SW_{cal}$ can control calibration based on a calibration control signal. FIG. 5 is a flowchart of an example method 500 for calibrating the temperature calibration circuit 110 in accordance with some embodiments, and FIG. 6 is a system 600 for calibrating the temperature calibration circuit 110 in accordance with some embodiments. The example method 500 is described herein with reference to elements shown in FIG. 6. Some operations of example method 500 can be performed in whole or in part by a human operator, processing units 420, memory 435, or any component of system 400, although embodiments are not limited thereto.

The example method 500 begins with operation 510 in which an operator puts a Helmholtz coil 602 inside a temperature oven 604, and then places a fluxgate magnetometer 404 at the center of the Helmholtz coil 602, with the sensing direction of the fluxgate magnetometer 100 being in the same direction of Helmholtz coil 602 axial field direction. The temperature in the oven is adjusted within a range of about −20° C. to 150° Celsius in operation 512 to provide a heat source to heat the fluxgate magnetometer 404 to a plurality of temperatures over this temperature range.

The example method 500 continues with operation 514 in which Cal Ctrl (FIG. 1) is driven with a square wave pulse train so that a calibration current of a square wave pulse train is provided to the detection coil L1 due to the repeated on/off connections between SWcal and Cal, with the Helmholtz coil 602 being controlled to generate a magnetic field with no AC component. In operation 516, the output data of the fluxgate magnetometer 404 is collected and recorded. For example, output measurements representative of the output signals $V_{out}$ may be recorded or stored such that the measurements are associated with the corresponding temperatures at which the measurements were obtained.

An example table associating output measurements with temperature is shown in Table 1. However, it will be appreciated that the data may not be representative of all situations or environments as may occur downhole and other data fields can be included, for example.

TABLE 1 adjusting magnetic field measurements for temperature sensitivity.

| Applied calibration field $B_{cal}$ through circuit 110 (Gauss) | Temperature (deg. Celsius) | Voltage amplitude of magnetometer output (V) |
|---|---|---|
| 0.101 | 85 | 1.005 |
| 0.103 | 95 | 1.009 |
| 0.104 | 105 | 1.010 |
| 0.107 | 110 | 1.073 |
| 0.109 | 120 | 1.014 |

In some embodiments, a best-fit curve can be generated based on the stored output measurements and corresponding temperatures, or perform any other processing, provide data for display, etc., based on the output measurements, temperatures, etc.

In operation 518, after the $SW_{cal}$ is switched to the Dis position (FIG. 1), the Helmholtz coil 602 is driven to generate a square wave magnetic field with a frequency equal to that of the calibration current as described in operation 514. In operation 520, the amplitude of the signal that drives the Helmholtz coil 602 is increased or decreased until the amplitude of the output of fluxgate magnetometer 404 is equal to that of the output signal data obtained in operation 516.

In operation 522, the current flowing in the Helmholtz coil 602 is measured and used to calculate the magnetic field generated by the Helmholtz coil 602. This magnetic field is equal to the calibration field $B_{cal}$ generated by the calibration current of operation 514. Operations 514-522 are repeated over different temperatures, for example over 18 different temperatures in the range of −20° C. and 150° C. with temperature increments of about 10° C. although embodiments are not limited to any particular temperature range or increment. When $V_{out}$ is measured, the α of the fluxgate magnetometer 404 at temperature T can be calculated according to:

$$\alpha = \frac{R_F + r}{V_{out}} B_{cal} \quad (7)$$

Operators can use Equation (7) to adjust magnetic field measurements received from the fluxgate magnetometer 404 at any temperature in real-time when the fluxgate magnetometer 404 is in downhole operation. As discussed earlier herein, high temperatures downhole can cause inaccuracies or errors associated with measurements taken using fluxgate magnetometers generally. Instead of or in addition to circuitry described above with respect to FIGS. 1-3, example embodiments provide adjustment methods to further compensate for these variations. The processing unit 420 can implement adjustment operations, although embodiments are not limited thereto.

During downhole operations, the fluxgate magnetometer 404 will provide output signals $V_{out}$ representative of a magnitude of a magnetic field $B_{ext}$ measured by the fluxgate magnetometer 404. The processing unit 420 may receive a temperature measurement representative of the temperature at which the output signal was generated from, for example, the thermistor 114.

The processing unit 420 will retrieve or calculate a corresponding adjusted α value that corresponds to the temperature measurement. The processing unit 420 may retrieve these or other values from the memory 435, from a telemetry message, from a remote storage location, etc. These or other values may have been previously stored according to operations described above with reference to FIGS. 5 and 6. The processing unit 420 will then generate an adjusted $B_{ext}$ based on the adjusted α value according to $$B_{ext} = -\frac{V_{out} \alpha}{R_F + r}$$

where $R_F$ is the feedback resistance of the feedback loop of the fluxgate magnetometer 404 and r is the resistance of the detection coil L1 of the fluxgate magnetometer 404.

Referring again to FIG. 4, in some embodiments, a logging system 400 comprises one or more of the fluxgate magnetometer 404, as well as a housing (not shown in FIG. 4) that can house the fluxgate magnetometer 404 or other electronics. The housing might take the form of a wireline tool body, or as described in more detail below with reference to FIGS. 7 and 8. The processing unit 420 may be part of a surface workstation or the processing unit 420 can be packaged with the fluxgate magnetometer 404 or attached to the housing.

The logging system 400 can additionally include a controller 425, a memory 435, an electronic apparatus 465, and a communications unit 440. The controller 425 and the memory 435 can be fabricated programmed to operate the fluxgate magnetometer 404 to acquire measurement data as the fluxgate magnetometer 404 is operated. The memory 435 can store measurements of formation parameters such that temperatures of the fluxgate magnetometer 404 at which a particular measurement are associated with that measurement. The memory 435 therefore may include a database, for example a relational database.

Electronic apparatus 465 can be used in conjunction with the controller 425 to perform tasks associated with taking measurements downhole with the fluxgate magnetometer 404. The communications unit 440 can include downhole communications in a drilling operation. Such downhole communications can include a telemetry system.

The logging system 400 can also include a bus 427, where the bus 427 provides electrical signal paths among the components of the logging system 400. The bus 427 can include an address bus, a data bus, and a control bus, each independently configured. The bus 427 can also use common conductive lines for providing one or more of address, data, or control, the use of which can be regulated by the controller 425. The bus 427 can include instrumentality for a communication network. The bus 427 can be configured such that the components of the logging system 400 are distributed. Such distribution can be arranged between downhole components such as the fluxgate magnetometer 404 and components that can be disposed on the surface of a well. Alternatively, various of these components can be co-located such as on one or more collars of a drill string or on a wireline structure.

In various embodiments, the logging system 400 includes peripheral devices that can include displays 455, additional storage memory, or other control devices that may operate in conjunction with the controller 425 or the memory 435. The display 455 can display combination logs, which the processing unit 420 generated according to embodiments described above.

In an embodiment, the controller 425 can be realized as one or more processors. The display 455 can be arranged to operate with instructions stored in the memory 435 to implement a user interface to manage the operation of the fluxgate magnetometer 404 or components distributed within the logging system 400. Such a user interface can be operated in conjunction with the communications unit 440 and the bus 427. Various components of the logging system 400 can be integrated with the fluxgate magnetometer 404 or associated housing such that processing identical to or similar to the processing schemes discussed with respect to various embodiments herein can be performed downhole.

In various embodiments, a non-transitory machine-readable storage device can comprise instructions stored thereon, which, when performed by a machine, cause the machine to perform operations, the operations comprising one or more features similar to or identical to features of methods and techniques described herein. A machine-readable storage device, herein, is a physical device that stores data represented by physical structure within the device. Examples of machine-readable storage devices can include, but are not limited to, memory 435 in the form of read only memory (ROM), random access memory (RAM), a magnetic disk storage device, an optical storage device, a flash memory, and other electronic, magnetic, or optical memory devices, including combinations thereof.

The physical structure of such instructions may be operated on by one or more processors such as, for example, the processing unit 420. Executing these physical structures can cause the machine to perform operations according to methods described herein. The instructions can include instructions to cause the processing unit 420 to store associated data or other data in the memory 435.

Downhole applications of the fluxgate magnetometer 404 include reception of EM telemetry downlink signals, reception of signals in EM telemetry repeaters, reception of signals used for ranging to magnetic objects or to objects carrying low frequency electric currents, mineralogy, and analysis of mud magnetic susceptibility.

It is anticipated that magnetic conditions deep within a borehole are considerably quieter than at the Earth's surface. Hence, the noise level for magnetic measurements should be somewhat lower than for surface measurements, making ultra-sensitive magnetometers usable downhole.

In the case of ranging applications, an oscillating magnetic field can be induced in a target that is to be located. This can be achieved with a rotating magnet on a drill bit, for example, or using an electromagnetic source, such as a transmitter. Alternating current can also be impressed on the casing of a target well, or the source of a time-varying magnetic field can be placed in the target well.

Figure 7:
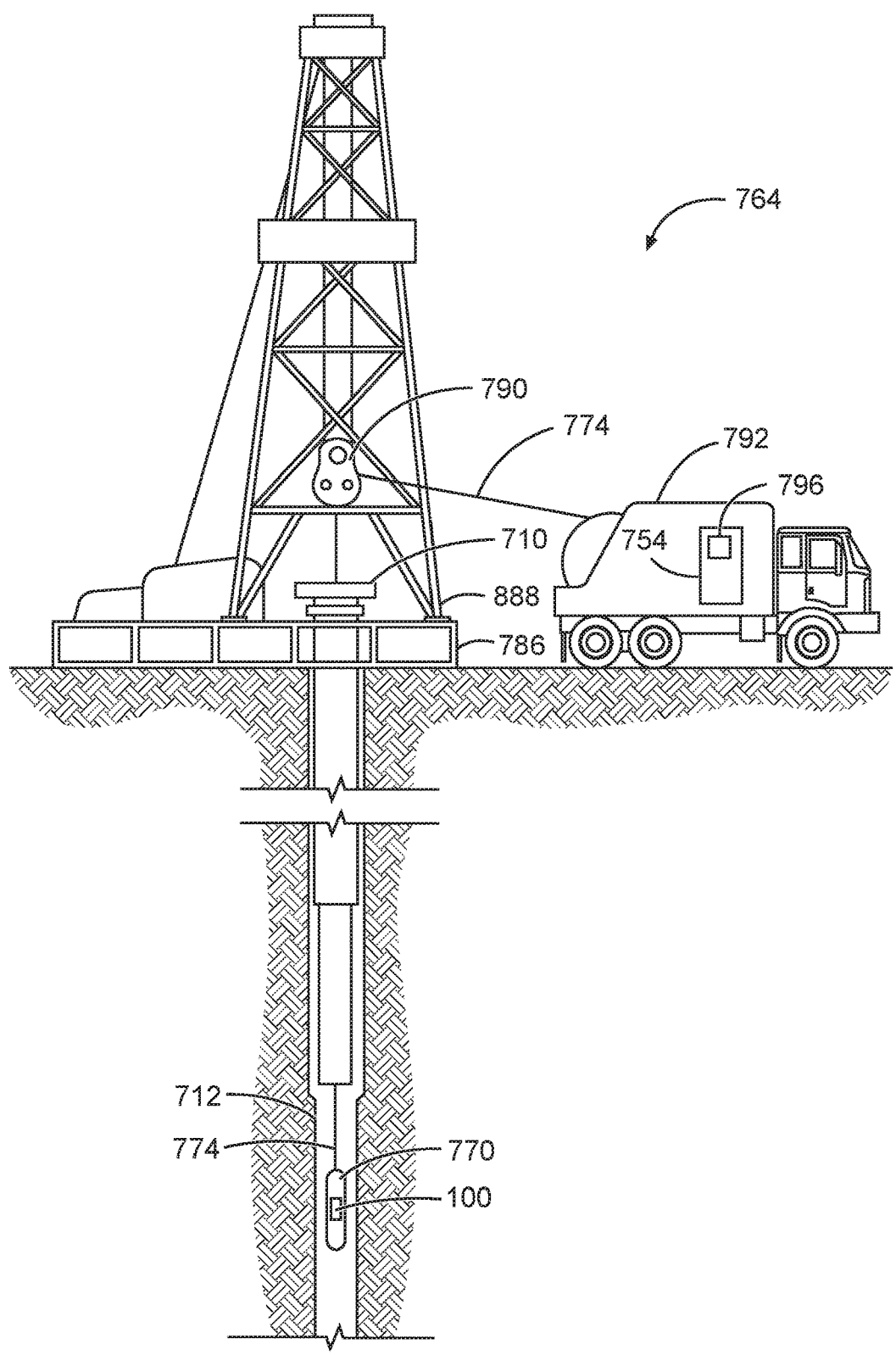
FIG. 7 illustrates a wireline system embodiment of the invention.
Figure 8:
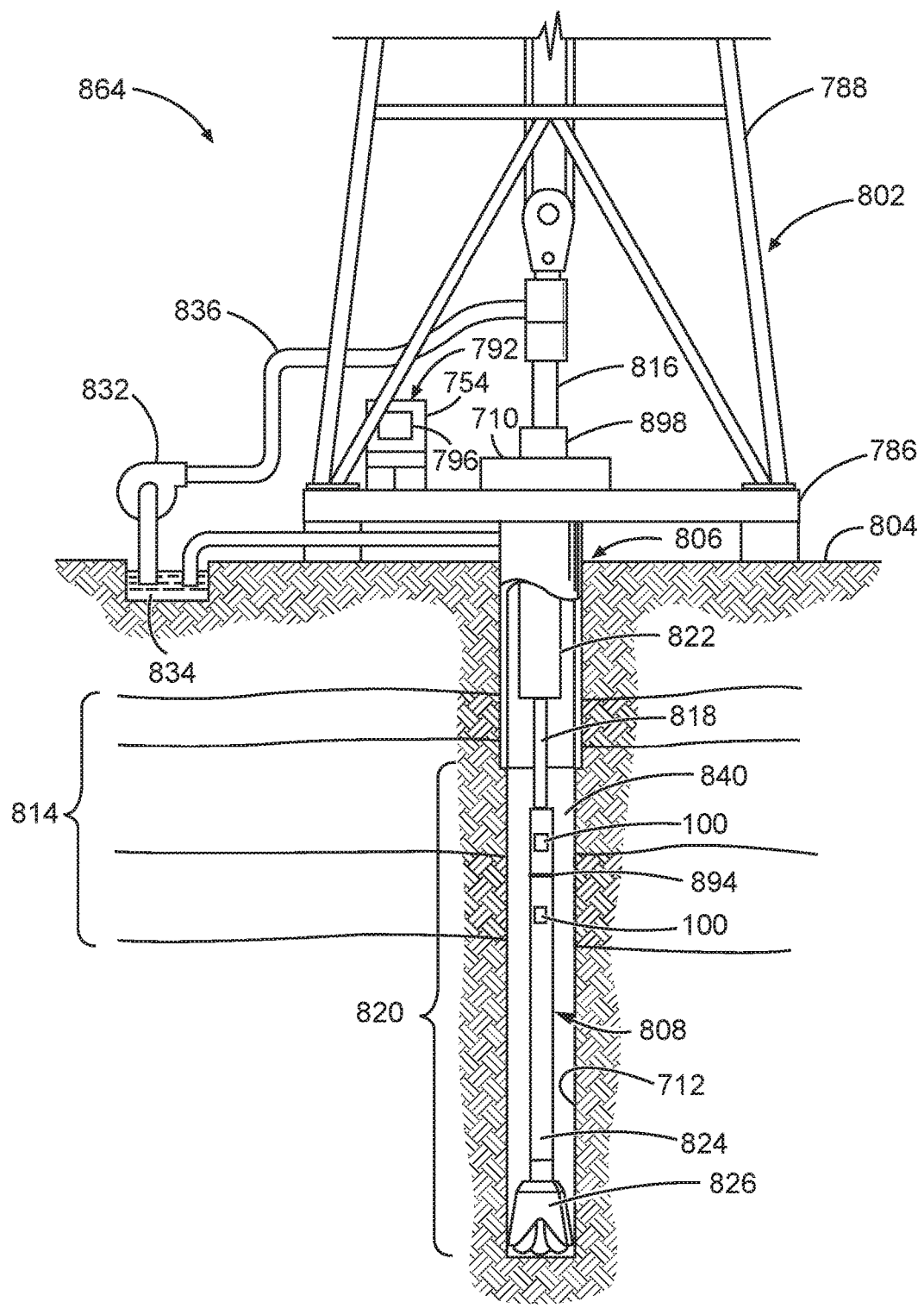
FIG. 8 illustrates a drilling rig system embodiment of the invention.

FIG. 7 illustrates a wireline system 764 embodiment of the invention, and FIG. 8 illustrates a drilling rig system 864 embodiment of the invention. Thus, the systems 764, 864 may comprise portions of a wireline logging tool body 770 as part of a wireline logging operation, or of a downhole tool 824 as part of a downhole drilling operation. Thus, FIG. 7 shows a well during wireline logging operations. In this case, a drilling platform 786 is equipped with a derrick 788 that supports a hoist 790.

Drilling oil and gas wells is commonly carried out using a string of drill pipes connected together so as to form a drilling string that is lowered through a rotary table 710 into a wellbore or borehole 712. Here it is assumed that the drilling string has been temporarily removed from the borehole 712 to allow a wireline logging tool body 770, such as a probe or sonde, to be lowered by wireline or logging cable 774 into the borehole 712. Typically, the wireline logging tool body 770 is lowered to the bottom of the region of interest and subsequently pulled upward at a substantially constant speed.

During the upward trip, at a series of depths the instruments (e.g., the fluxgate magnetometer 404 shown in FIG. 1) included in the tool body 770 may be used to perform measurements on the subsurface geological formations adjacent the borehole 712 (and the tool body 770). The measurement data can be communicated to a surface logging facility 792 for storage, processing, and analysis. The logging facility 792 may be provided with electronic equipment for various types of signal processing, which may be implemented by any one or more of the components of the fluxgate magnetometer 100. Similar formation evaluation data may be gathered and analyzed during drilling operations (e.g., during LWD operations, and by extension, sampling while drilling).

In some embodiments, the tool body 770 comprises a magnetic tool for obtaining and analyzing magnetic field measurements in a subterranean formation through a borehole 712. The tool is suspended in the wellbore by a wireline cable 774 that connects the tool to a surface control unit (e.g., comprising a workstation 754). The tool may be deployed in the borehole 712 on coiled tubing, jointed drill pipe, hard wired drill pipe, or any other suitable deployment technique.

Turning now to FIG. 8, it can be seen how a system 864 may also form a portion of a drilling rig 802 located at the surface 804 of a well 806. The drilling rig 802 may provide support for a drill string 808. The drill string 808 may operate to penetrate the rotary table 710 for drilling the borehole 712 through the subsurface formations 814. The drill string 808 may include a Kelly 816, drill pipe 818, and a bottom hole assembly 820, perhaps located at the lower portion of the drill pipe 818.

The bottom hole assembly 820 may include drill collars 822, a downhole tool 824, and a drill bit 826. The drill bit 826 may operate to create the borehole 712 by penetrating the surface 804 and the subsurface formations 815. The downhole tool 824 may comprise any of a number of different types of tools including MWD tools, LWD tools, and others.

During drilling operations, the drill string 808 (perhaps including the Kelly 816, the drill pipe 818, and the bottom hole assembly 820) may be rotated by the rotary table 710. Although not shown, in addition to, or alternatively, the bottom hole assembly 820 may also be rotated by a motor (e.g., a mud motor) that is located downhole. The drill collars 822 may be used to add weight to the drill bit 826. The drill collars 822 may also operate to stiffen the bottom hole assembly 820, allowing the bottom hole assembly 820 to transfer the added weight to the drill bit 826, and in turn, to assist the drill bit 826 in penetrating the surface 804 and subsurface formations 814.

During drilling operations, a mud pump 832 may pump drilling fluid (sometimes known by those of ordinary skill in the art as "drilling mud") from a mud pit 834 through a hose 836 into the drill pipe 818 and down to the drill bit 826. The drilling fluid can flow out from the drill bit 826 and be returned to the surface 804 through an annular area 840 between the drill pipe 818 and the sides of the borehole 712. The drilling fluid may then be returned to the mud pit 834, where such fluid is filtered. In some embodiments, the drilling fluid can be used to cool the drill bit 826, as well as to provide lubrication for the drill bit 826 during drilling operations. Additionally, the drilling fluid may be used to remove subsurface formation cuttings created by operating the drill bit 826.

Thus, it may be seen that in some embodiments, the systems 764, 864 may include a drill collar 822, a downhole tool 824, and/or a wireline logging tool body 770 to house one or more fluxgate magnetometers 100, similar to or identical to the fluxgate magnetometer 100 described above and illustrated in FIG. 1. Components of the system 400 in FIG. 4 may also be housed by the tool 824 or the tool body 770.

Thus, for the purposes of this document, the term "housing" may include any one or more of a drill collar 822, a downhole tool 824, or a wireline logging tool body 770 (all having an outer wall, to enclose or attach to magnetometers, sensors, fluid sampling devices, pressure measurement devices, transmitters, receivers, acquisition and processing logic, and data acquisition systems). The tool 824 may comprise a downhole tool, such as an LWD tool or MWD tool. The wireline tool body 770 may comprise a wireline logging tool, including a probe or sonde, for example, coupled to a logging cable 774. Many embodiments may thus be realized.

Thus, a system 764, 864 may comprise a downhole tool body, such as a wireline logging tool body 770 or a downhole tool 824 (e.g., an LWD or MWD tool body), and one or more fluxgate magnetometers 100 attached to the tool body, the fluxgate magnetometer 100 to be constructed and operated as described previously.

Any of the above components, for example the fluxgate magnetometers 100, processing units 420, etc., may all be characterized as "modules" herein. Such modules may include hardware circuitry, and/or a processor and/or memory circuits, software program modules and objects, and/or firmware, and combinations thereof, as desired by the architect of the fluxgate magnetometer 100 and systems 400, 764, 864 and as appropriate for particular implementations of various embodiments. For example, in some embodiments, such modules may be included in an apparatus and/or system operation simulation package, such as a software electrical signal simulation package, a power usage and distribution simulation package, a power/heat dissipation simulation package, and/or a combination of software and hardware used to simulate the operation of various potential embodiments.

It should also be understood that the apparatus and systems of various embodiments can be used in applications other than for logging operations, and thus, various embodiments are not to be so limited. The illustrations of fluxgate magnetometer 100 and systems 400, 764, 864 are intended to provide a general understanding of the structure of various embodiments, and they are not intended to serve as a complete description of all the elements and features of apparatus and systems that might make use of the structures described herein.

Applications that may include the novel apparatus and systems of various embodiments include electronic circuitry used in high-speed computers, communication and signal processing circuitry, modems, processor modules, embedded processors, data switches, and application-specific modules. Some embodiments include a number of methods.

It should be noted that the methods described herein do not have to be executed in the order described, or in any particular order. Moreover, various activities described with respect to the methods identified herein can be executed in iterative, serial, or parallel fashion. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. For example, the programs may be structured in an object-orientated format using an object-oriented language such as Java or C#. In another example, the programs can be structured in a procedure-orientated format using a procedural language, such as assembly or C. The software components may communicate using any of a number of mechanisms well known to those skilled in the art, such as application program interfaces or interprocess communication techniques, including remote procedure calls. The teachings of various embodiments are not limited to any particular programming language or environment. Thus, other embodiments may be realized.

In summary, using the apparatus, systems, and methods disclosed herein may provide increased magnetic field measurement sensitivity over a wider range of temperatures relative to conventional mechanisms. As a result, the depth, range, and/or data rate of electromagnetic telemetry systems may be extended, as may the range at which magnetic bodies and oscillating electromagnetic sources can be sensed remotely. A combination of these advantages can significantly enhance the value of the services provided by an operation/exploration company, while at the same time controlling time-related costs.

Further examples of apparatuses, methods, a means for performing acts, systems or devices include, but are not limited to:

Example 1 is a device (e.g., a magnetic field measurement device, a fluxgate magnetometer, a magnetometer, etc.) or other apparatus comprising an excitation circuit including an excitation circuit including an excitation coil that is coupled to a resonation control circuit, the excitation coil being wound around an amorphous soft magnetic core; a detection circuit including a detection coil, the detection coil being would around the amorphous soft magnetic core; and the resonation control circuit coupled to the excitation circuit and to the detection circuit to adjust a resonant frequency of the detection circuit responsive to temperature variations of the amorphous soft magnetic core.

Example 2 may include or use, or may optionally be combined with the subject matter of Example 1 to include wherein the resonation control circuit includes an operational amplifier with an inverting input coupled to the excitation circuit such that a direct current (DC) output of the operational amplifier varies according to inductance changes of the excitation circuit; and a variable capacitive element coupled between the detection circuit and the output of the operational amplifier to adjust capacitance of the detection circuit responsive to variations in the DC output of the operational amplifier.

Example 3 may include or use, or may optionally be combined with the subject matter of Examples 1-2, to further include an integrator circuit coupled to the detection circuit to integrate an output of the detection circuit, the integrator circuit including an integration amplifier with symmetrical circuitry coupled to each of an inverting input and a non-inverting input of the integration amplifier; and a switch circuit including a first switching mechanism and a second switching mechanism, coupled to the inverting input and the non-inverting input of the integration amplifier such that the inverting input is coupled to the output of the detection coil and the non-inverting input is coupled to ground during a positive phase of the output of the detection circuit, and the inverting input is coupled to ground and the non-inverting input is coupled to the output of the detection coil during a negative phase of the output of the detection circuit.

Example 4 may include or use, or may optionally be combined with the subject matter of Examples 1-3, to further comprise clock input, which is phase locked to the excitation input of the excitation circuit, to control the first switching mechanism and the second switching mechanism to switch at a frequency double the frequency of the excitation input to the excitation circuit.

Example 5 may include or use, or may optionally be combined with the subject matter of Examples 1-3, to further comprise a first capacitive element coupled to the first switching mechanism to absorb voltage spikes generated by the first switching mechanism; and a second capacitive element coupled to the second switching mechanism to absorb voltage spikes generated by the second switching mechanism.

Example 6 may include or use, or may optionally be combined with the subject matter of Examples 1-3, and further comprising a gain stage coupled to the output of the integrator circuit, the gain stage including an operational amplifier with gain-setting resistors.

Example 7 is a system, which can include portions of any of Examples 1-6, comprising a downhole tool housing; and a fluxgate magnetometer housed in the downhole tool housing and including an excitation circuit, and a detection circuit, the excitation circuit including an excitation coil, the excitation coil being wound around an amorphous soft magnetic core, inductance variation of the excitation coil being used to stabilize the resonation of the detection circuit; the detection circuit including a detection coil, the detection coil being wound around the amorphous soft magnetic core such that a resonant frequency of the detection circuit is tuned to a driving frequency of the excitation circuit; and a resonation control circuit coupled to the excitation circuit and the detection circuit to adjust the resonant frequency of the detection circuit responsive to the permeability variations of the amorphous soft magnetic core with temperature.

Example 8 can include the subject matter of Example 7, and optionally further include a temperature calibration circuit to couple to the detection coil of the fluxgate magnetometer during a calibration phase of the fluxgate magnetometer, the temperature calibration circuit including a voltage source to inject a signal to the detection coil to generate a calibration magnetic field in the fluxgate magnetometer, and a calibration switch to control calibration based on a calibration control signal.

Example 9 can include the subject matter of any of Examples 7-8, and optionally further comprising a temperature sensor to measure temperature of the magnetometer.

Example 10 can include the subject matter of any of Examples 7-9, and further optionally comprising one or more processors to control a heat source to change temperatures through the temperature range during a calibration process; and receive values representative of output signals of the fluxgate magnetometer through the temperature range.

Example 11 can include the subject matter of any of Examples 7-10, and further optionally comprising memory to store values representative of a magnitude of the calibration magnetic field such that the values are associated with respective temperatures through the temperature range.

Example 12 can include the subject matter of any of Examples 7-11, wherein the downhole tool housing optionally comprises one of a wireline tool body, a measurement while drilling downhole tool, or a logging while drilling downhole tool.

Example 13 is a method comprising operations wherein any of Examples 1-12 can include means for performing the method of Example 13, and wherein the method of Example 13 comprises providing a heat source to heat a fluxgate magnetometer to a plurality of temperatures over a temperature range, the fluxgate magnetometer including an excitation coil, a detection coil wound around an amorphous soft magnetic core, and a resonation control circuit, such that a detection circuit including the detection coil resonates at an excitation frequency of the excitation coil, wherein the resonation of the detection coil is controlled by the detection circuit inductance change according to the permeability variation of the amorphous soft magnetic core with temperature; providing calibration currents to the detection coil of the fluxgate magnetometer, at each temperature of the temperature range, to generate calibration magnetic fields $B_{cal}$ in the fluxgate magnetometer; measuring and recording output signals $V_{out}$ of the fluxgate magnetometer generated in response to the calibration currents.

Example 14 includes the subject matter of Example 13, and further optionally including measuring and recording values of a ratio $\alpha$ at the temperature at which the magnetometer operates, wherein the ratio $\alpha$ is a ratio of a feedback magnetic field to a feedback current in the feedback loop; and wherein the method further optionally comprises adjusting measurements received from the fluxgate magnetometer based on the ratio $\alpha$ after the fluxgate magnetometer is placed downhole to generate adjusted magnetic field measurements.

Example 15 includes the subject matter of any of Examples 13-14, and further optionally including receiving the output signal $V_{out}$ from the fluxgate magnetometer representative of a magnitude of a magnetic field $B_{ext}$ measured by the fluxgate magnetometer; receiving a temperature measurement representative of the temperature at which the output signal was generated; retrieving a corresponding adjusted $\alpha$ value that corresponds to the temperature measurement; and generating an adjusted $B_{ext}$ based on the adjusted $\alpha$ value according to $$B_{ext} = -\frac{V_{out}\alpha}{R_F + r}$$

where $R_F$ is a feedback resistance of the feedback loop of the fluxgate magnetometer and r is a resistance of the detection coil of the fluxgate magnetometer.

Example 16 includes the subject matter of any of Examples 13-15, further optionally including storing measurements representative of the output signals $V_{out}$ such that the measurements are associated with corresponding temperatures at which the measurements were obtained.

Example 17 includes the subject matter of Example 16, and optionally further comprising generating a best-fit curve based on the stored measurements and corresponding temperatures; and extrapolating a value for calibration magnetic fields $B_{cal}$ based on the best-fit curve.

Example 18 includes computer-readable medium including instructions that, when executed on a processing unit, cause the processing unit to perform any of the functions of Examples 1-17, including control to a heat source to cause the heat source to heat a fluxgate magnetometer to a plurality of temperatures over a temperature range, the fluxgate magnetometer including an excitation coil, a detection coil wound around an amorphous soft magnetic core, and a resonation control circuit, such that a detection circuit including the detection coil resonates at an excitation frequency of the excitation coil, wherein the resonation of the detection coil is controlled by the detection circuit inductance change according to the permeability variation of the amorphous soft magnetic core with temperature; provide control to provide calibration currents to the detection coil of the fluxgate magnetometer, at each temperature of the temperature range, to generate calibration magnetic fields $B_{cal}$ in the fluxgate magnetometer; and measure and recording output signals $V_{out}$ of the fluxgate magnetometer generated in response to the calibration currents.

Example 19 includes the subject matter of Example 18, and further optionally including instructions to cause the processing unit to store measurements representative of the output signals $V_{out}$ such that the measurements are associated with corresponding temperatures at which the measurements were obtained.

Example 20 includes the subject matter of any of Examples 18-19, and further optionally including instructions to cause the processing unit to receive the output signal $V_{out}$ from the fluxgate magnetometer representative of a magnitude of a magnetic field $B_{ext}$ measured by the fluxgate magnetometer; receive a temperature measurement representative of the temperature at which the output signal was generated; retrieve a corresponding adjusted $\alpha$ value that corresponds to the temperature measurement; and generate an adjusted $B_{ext}$ based on the adjusted $\alpha$ value according to $$B_{ext} = -\frac{V_{out}\alpha}{R_F + r}$$

where $R_F$ is a feedback resistance of the feedback loop of the fluxgate magnetometer and r is a resistance of the detection coil of the fluxgate magnetometer.

Example 21 includes the subject matter of Example 19, and further optionally including causing the processing unit to generate a best-fit curve based on the stored measurements and corresponding temperatures; and extrapolate a value for calibration magnetic fields $B_{cal}$ based on the best-fit curve.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

Although specific embodiments have been illustrated and described herein, it will be appreciated by those of ordinary skill in the art that any arrangement that is calculated to achieve the same purpose may be substituted for the specific embodiments shown. Various embodiments use permutations or combinations of embodiments described herein. It is to be understood that the above description is intended to be illustrative, and not restrictive, and that the phraseology or terminology employed herein is for the purpose of description. Combinations of the above embodiments and other embodiments will be apparent to those of ordinary skill in the art upon studying the above description.

What is claimed is:

1. A magnetic field measurement device, comprising:
   an excitation circuit including an excitation coil that is coupled to a resonation control circuit, the excitation coil being wound around an amorphous soft magnetic core;
   a detection circuit including a detection coil, the detection coil being wound around the amorphous soft magnetic core; and
   the resonation control circuit coupled to the excitation circuit and to the detection circuit to adjust a resonant frequency of the detection circuit responsive to temperature variations of the amorphous soft magnetic core.

2. The magnetic field measurement device of claim 1, wherein the resonation control circuit includes
   an operational amplifier with an inverting input coupled to the excitation circuit such that a direct current (DC) output of the operational amplifier varies according to inductance changes of the excitation circuit; and
   a variable capacitive element coupled between the detection circuit and the output of the operational amplifier to adjust capacitance of the detection circuit responsive to variations in the DC output of the operational amplifier.

3. The magnetic field measurement device of claim 1, comprising:
   an integrator circuit coupled to the detection circuit to integrate an output of the detection circuit, the integrator circuit including an integration amplifier with symmetrical circuitry coupled to each of an inverting input and a non-inverting input of the integration amplifier; and a switch circuit including a first switching mechanism and a second switching mechanism, coupled to the inverting input and the non-inverting input of the integration amplifier such that the inverting input is coupled to the output of the detection coil and the non-inverting input is coupled to ground during a positive phase of the output of the detection circuit, and the inverting input is coupled to ground and the non-inverting input is coupled to the output of the detection coil during a negative phase of the output of the detection circuit.

4. The magnetic field measurement device of claim 3, comprising:

a clock input, which is phase locked to an excitation output of the excitation circuit, to control the first switching mechanism and the second switching mechanism to switch at a frequency double the frequency of the excitation input to the excitation circuit.

5. The magnetic field measurement device of claim 3, comprising:

a first capacitive element coupled to the first switching mechanism to absorb voltage spikes generated by the first switching mechanism; and a second capacitive element coupled to the second switching mechanism to absorb voltage spikes generated by the second switching mechanism.

6. The magnetic field measurement device of claim 3, further comprising a gain stage coupled to the output of the integrator circuit, the gain stage including an operational amplifier with gain-setting resistors.

\* \* \* \* \*